United States Patent
Zhang et al.

(10) Patent No.: US 9,502,336 B2
(45) Date of Patent: Nov. 22, 2016

(54) CORELESS SUBSTRATE WITH PASSIVE DEVICE PADS

(71) Applicant: Intel Corporation, Santa Clara, CA (US)

(72) Inventors: Qinglei Zhang, Chandler, AZ (US); Yueli Liu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/801,822

(22) Filed: Mar. 13, 2013

(65) Prior Publication Data
US 2014/0268612 A1    Sep. 18, 2014

(51) Int. Cl.
*H05K 7/10* (2006.01)
*H01L 23/492* (2006.01)
(Continued)

(52) U.S. Cl.
CPC ......... *H01L 23/492* (2013.01); *H01L 21/4857* (2013.01); *H01L 21/6835* (2013.01); *H01L 23/49822* (2013.01); *H01L 25/16* (2013.01); *H05K 3/4682* (2013.01); *H01L 21/486* (2013.01); *H01L 23/49827* (2013.01);
(Continued)

(58) Field of Classification Search
CPC ................... H01L 23/492; H01L 23/50; H01L 24/06; H01L 25/16; H01L 28/60; H05K 3/4682
USPC ........ 174/255, 260, 256, 261, 262; 361/795, 361/760, 767, 763, 764; 257/668, 700, 702, 257/738
See application file for complete search history.

(56) References Cited

U.S. PATENT DOCUMENTS 6,229,095 B1 * 5/2001 Kobayashi .................... 174/255
6,373,717 B1 * 4/2002 Downes et al. ............... 361/795
(Continued)

FOREIGN PATENT DOCUMENTS

EP         2 068 605 A1    6/2009
KR       20090086076 A     8/2009
KR       20100044084 A     4/2010

OTHER PUBLICATIONS

Communication pursuant to Article 94(3) EPC, issued in corresponding European Application No. 14 158 382.3, mailed Sep. 10, 2014, 4 pages.
(Continued)

*Primary Examiner* — Yuriy Semenenko
(74) *Attorney, Agent, or Firm* — Schwabe, Williamson & Wyatt, P.C.

(57) ABSTRACT

Embodiments of the present disclosure are directed towards coreless substrates with passive device pads, as well as methods for forming coreless substrates with passive device pads and package assemblies and systems incorporating such coreless substrates. A coreless substrate may comprise a plurality of build-up layers, such as bumpless build-up layers (BBUL). In various embodiments, electrical routing features and passive device pads may be disposed on an outer surface of the substrate. In various embodiments, the passive device pads may be coupled with a conductive element disposed on or within the build-up layers. In various embodiments, an electrical path may be defined in the plurality of build-up layers to route electrical power between the passive device pads and a die coupled to the coreless substrate.

11 Claims, 16 Drawing Sheets

(51) Int. Cl.
  *H01L 25/16* (2006.01)
  *H05K 3/46* (2006.01)
  *H01L 23/498* (2006.01)
  *H01L 21/48* (2006.01)
  *H01L 21/683* (2006.01)
  *H01L 49/02* (2006.01)
  *H01L 23/00* (2006.01)

(52) U.S. Cl.
  CPC ............... *H01L 24/13* (2013.01); *H01L 24/16* (2013.01); *H01L 28/60* (2013.01); *H01L 2221/68345* (2013.01); *H01L 2221/68381* (2013.01); *H01L 2224/13101* (2013.01); *H01L 2224/16225* (2013.01); *H01L 2224/16237* (2013.01); *H01L 2924/12042* (2013.01); *H01L 2924/15311* (2013.01)

(56) References Cited

U.S. PATENT DOCUMENTS

| | | | |
|---|---|---|---|
| 6,400,576 B1* | 6/2002 | Davidson | 361/763 |
| 2002/0159243 A1* | 10/2002 | Ogawa et al. | 361/760 |
| 2005/0218516 A1* | 10/2005 | Lloyd et al. | 257/738 |
| 2005/0250310 A1* | 11/2005 | Ogawa | 438/622 |
| 2007/0001261 A1* | 1/2007 | Tanaka | 257/532 |
| 2009/0236750 A1* | 9/2009 | Chia | 257/774 |
| 2010/0084163 A1* | 4/2010 | Kodani et al. | 174/250 |
| 2010/0096744 A1 | 4/2010 | Mori et al. | |
| 2011/0228464 A1* | 9/2011 | Guzek et al. | 361/679.31 |
| 2012/0098091 A1 | 4/2012 | Ikemoto et al. | |
| 2012/0181072 A1 | 7/2012 | Niki et al. | |

OTHER PUBLICATIONS

European Search Report (under R.61 or R.63 EPC), issued in corresponding European Application No. 14 158 382.3, mailed Sep. 24, 2014, 3 pages.

Final Rejection mailed Jan. 21, 2016 for Korean Application No. 2014-0028864, 5 pages.

Notice of Preliminary Rejection dated Jul. 3, 2015 for Korean Patent Application No. 2014-0028864; 16 pages (7 pages of translation and 9 pages of Korean Action).

Final Rejection mailed Dec. 1, 2015 for Korean Application No. 2014-0028864, 5 pages.

\* cited by examiner

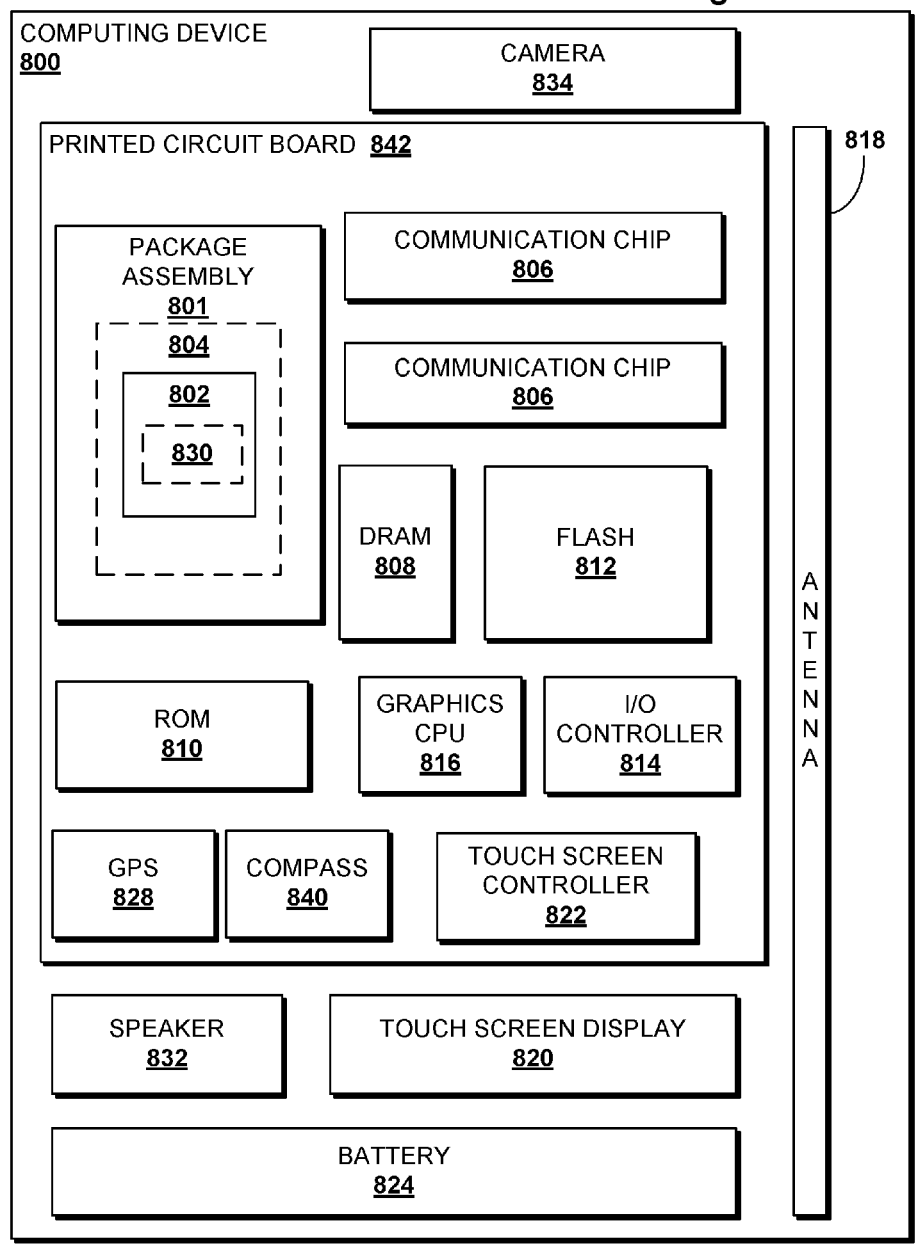

CORELESS SUBSTRATE WITH PASSIVE DEVICE PADS

FIELD

Embodiments of the present disclosure generally relate to the field of integrated circuits, and more particularly, to techniques and configurations for a package assembly with a coreless substrate and two or more passive device pads on the back side of the coreless substrate.

BACKGROUND

Decoupling capacitors are provided in some conventional IC packages to reduce system noise and suppress radiation. As mobile devices continue to shrink, decreasing form factor dimensions require smaller package assemblies. Coreless substrate packages may allow greater wiring density and relatively low cost in comparison to conventional packages. However, current process flows for coreless substrates do not provide land side passive device pad formation.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIG. 8 schematically illustrates a computing device, in accordance with various embodiments.

DETAILED DESCRIPTION

Figure 1:
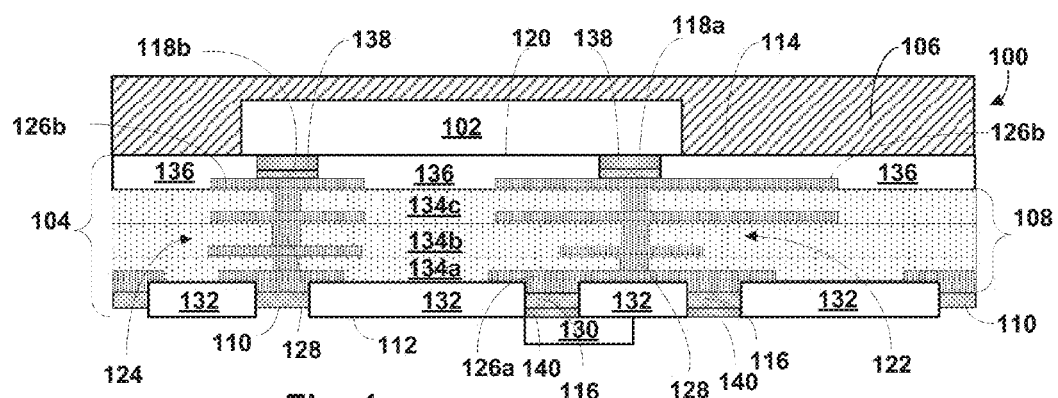
FIG. 1 illustrates a cross-section side view of an example package assembly including a primary logic die and a coreless substrate with two land side passive device pads connected by a conductive element, in accordance with various embodiments.

Embodiments of the present disclosure describe techniques and configurations for forming coreless substrates with passive device pads. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as back/front, top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Figure 2:
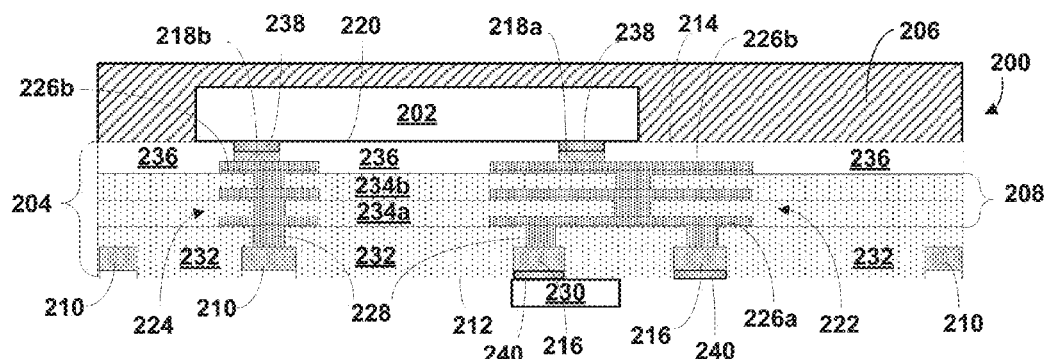
FIG. 2 illustrates a cross-section side view of another example package assembly including a primary logic die and a coreless substrate with two land side passive device pads connected by a conductive element, in accordance with various embodiments.
Figure 3:
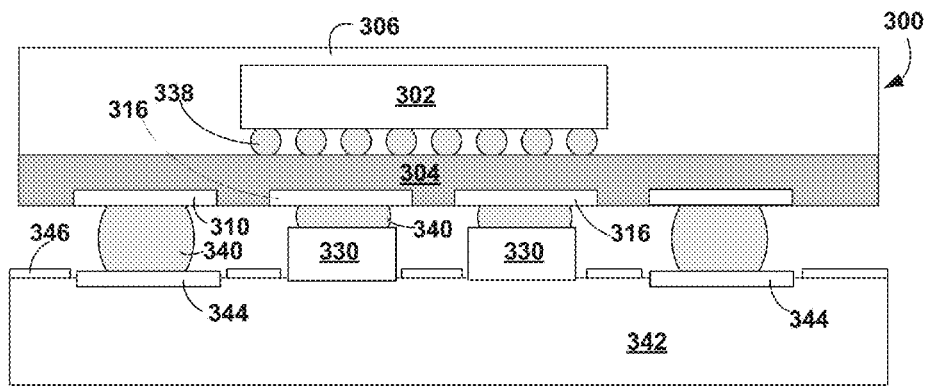
FIG. 3 illustrates a schematic cross-section side view of an example package assembly with a primary logic die, coreless substrate with land side passive device pads, and circuit board, in accordance with various embodiments.

FIGS. 1 and 2 depict side cross-sectional views of package assemblies 100 and 200, respectively. FIG. 3 depicts a schematic side cross-sectional view of a package assembly 300. In these Figures, like components are numbered in a similar manner unless otherwise indicated. Therefore, any description of a component should be understood to apply equally to components identified by such like numbering, unless otherwise indicated. For example, die 102 of FIG. 1 is depicted in FIG. 2 as 202 and in FIG. 3 as 302, and any description of die 102 should be understood to apply equally to die 202 and die 302. As another example, passive device pad 116 of FIG. 1 is depicted in FIG. 2 as 216 and in FIG. 3 as 316.

FIG. 1 illustrates a cross-section side view of an example package assembly 100 including a die 102 and a coreless substrate 104 with two land side passive device pads 116 connected by a conductive element 126a, in accordance with various embodiments.

Coreless substrate 104 may include a first side 112 and a second side 114 opposite to the first side 112 of coreless substrate 104. Two or more passive device pads 116 may be disposed on the first side 112. One or more electrical routing features 110 may also be disposed on the first side 112 of coreless substrate 104. In various embodiments, electrical routing features 110 may include a ball grid array ("BGA") or other electrical components that may route electrical signals between primary logic die 102 and other components (e.g., circuit board 342 of FIG. 3) to which package assembly 100 is attached. Other electrical routing features 118a-b may be disposed on the second side 114 of coreless substrate 104. In various embodiments, electrical routing features 118a-b may include or be one or more die bond pads. In various embodiments, electrical routing features 118a-b may be coupled to active side 120 of primary logic die 102 by interconnect elements 138.

In some embodiments, interconnect elements 138 may include solderable material or another conductive material. In various embodiments, electrical routing features 110, electrical routing features 118a-b, and/or passive device pads 116 may include one or more layers of copper, gold, palladium, and/or nickel, in any combination. In other embodiments, electrical routing features 118a-b may include electroless nickel immersion gold (ENIG) or ENIG and electroless gold (ENIG EG). In still other embodiments, electrical routing features 1118a-b may include one or more of electroless Nickel, electroless Palladium and Immersion gold (ENEPIG), immersion Tin (ImSn), direct immersion gold (DIG), organic preservative solderability (OSP), and electroless Palladium immersion gold (EPIG).

In various embodiments, coreless substrate 104 may have a first outer layer 132 disposed on the first side 112 and a second outer layer 136 disposed on the opposite second side 114. Electrical routing features 110 and passive device pads 116 may be disposed within openings in first outer layer 132. Electrical routing features 118a-b may be disposed within openings in second outer layer 136. In some embodiments, each of first outer layer 132 and second outer layer 136 may be, or may include, a solder resist layer. The package assembly 100 may include a plurality of build-up layers 108. For example, the plurality of build-up layers 108 may include one or more build-up layers 134a-c disposed between the first outer layer 132 and the second outer layer 136. Build-up layers 134a-c may include dielectric layers formed with, for example, an Ajinomoto Build-up Film (ABF) substrate. While FIG. 1 illustrates three build-up layers 134a (first build-up layer), 134b (second build-up layer), and 134c (outermost build-up layer), other embodiments may have one, two, four, or more than four build-up layers.

The plurality of build-up layers 108 may include a plurality of conductive elements 126a-b and connectors 128. Conductive elements 126a-b may be formed as traces or other structures on or between build-up layers. Connectors 128 may be conductive features such as metal-filled or plated vias that interconnect the conductive elements 126a-b to form the first and second electrical paths 122/124. In various embodiments, conductive elements 126a-b and/or connectors 128 may include copper or another metal.

In various embodiments, first electrical path 122 may include at least one conductive element 126a that is disposed on or between two of the plurality of build-up layers 108. Two or more passive device pads 116 may be coupled with conductive element 126a. As can be seen, the two or more passive device pads 116 may be connected to one conductive element 126a). Other conductive elements are indicated as 126b. Although vias in the drawings are shown as having uniformly straight sides, vias may have other shapes as well. For example, vias drilled by lasers may tend to have tapered shapes, e.g., with one end being larger than the opposite end.

In various embodiments, a first electrical path 122 may be formed in plurality of build-up layers 108 between passive device pads 116 on first side 112 and a first electrical routing feature 118a on second side 114. A second electrical path 124 may be formed in plurality of build-up layers 108 between electrical routing feature 110 on first side 112 and another of the electrical routing features 118b on second side 114. Thus, first electrical path 122 may route electrical signals between active surface 120 of primary logic die 102 and a capacitor, such as capacitor 130, and second electrical path 124 may route electrical signals between active surface 120 of primary logic die 102 and other components, such as circuit board 342 of FIG. 3. In some embodiments, the electrical signals may include, for example, input/output (I/O) signals and/or power or ground signals associated with the operation of the die 102. In various embodiments, first electrical path 122 and second electrical path 124 may not include solder, as they may be fabricated with other suitable components using a BBUL process.

FIG. 2 illustrates a cross-section side view of another example package assembly including a primary logic die 202 and a coreless substrate 204 with two land side passive device pads 216 and a capacitor 230, in accordance with various embodiments. Again, features that are similar are indicated using the above-discussed numbering convention.

In some embodiments, as discussed above with regard to FIG. 1, each of the first outer layer 132 and the second outer layer 136 may be, or may include, a layer of solder resist material. Alternatively, as shown for example in FIG. 2, the first outer layer 232 may be a dielectric layer, and the second outer layer 236 may be a layer of solder resist. Build-up layers 234a-b may be disposed between first outer layer 232 and second outer layer 236. In some embodiments, the first outer layer 232 may be formed with, for example, an Ajinomoto Build-up Film (ABF) substrate. Again, electrical routing features 210 and passive device pads 216 may be disposed within openings in first outer layer 232. Electrical routing features 218a-b may be disposed within openings in second outer layer 236. In various embodiments, as shown for example in FIG. 2, conductive element 226a may be coupled to passive device pads 216 by connectors 228.

FIG. 3 illustrates a schematic cross-section side view of an example package assembly 300 with a die 302, a coreless substrate 304 with land side passive device pads 316, and a circuit board 342, in accordance with various embodiments. In various embodiments, die 302 may be a processor core with transistors and other components that together may form all or part of the "brain" of a computing device in which package assembly 300 is installed. In various embodiments, package assembly 300 may also include a secondary logic die (e.g., another processor core) configured to supplement the processing power of primary logic die. In various other embodiments, the secondary die (not shown) may be a die that is included on package assembly 300 to simplify a system/platform into which package assembly 300 is installed, such as a memory die or a power management die.

The die 302 can be attached to the coreless substrate 304 according to a variety of suitable configurations including, a flip-chip configuration, as depicted, or other configurations such as wirebonding and the like. In the flip-chip configuration, an active side of the die 302 is attached to a surface of the package substrate 304 using die interconnect elements 338 such as bumps, pillars, or other suitable structures. The active side of the die 302 may have one or more transistor devices formed thereon. The die 302 may represent a discrete chip and may be, include, or be a part of a processor, memory, or ASIC in some embodiments. In some embodiments, an encapsulant 306 such as, for example, molding compound or underfill material may fully or partially encapsulate the die 302.

Die interconnect elements 338 may be configured to route electrical signals between the die 302 and the coreless substrate 304. In some embodiments, the electrical signals may include, for example, input/output (I/O) signals and/or power or ground signals associated with the operation of the die 302.

In some embodiments, the coreless substrate 304 is an epoxy-based laminate substrate having build-up layers such as, for example, an Ajinomoto Build-up Film (ABF) substrate. Coreless substrate 304 may include a plurality of "bumpless" build-up layers ("BBUL"). As used herein, "bumpless build-up layers" may refer to layers of substrate and components embedded therein without the use of solder or other attaching means that may be considered "bumps." As shown in further detail in FIGS. 1 and 2, the coreless substrate 304 may include structures configured to route electrical signals to or from the die 302. The structures may include, for example, traces, trenches, vias or other interconnect structures to route electrical signals through the coreless substrate 304.

Package level interconnect elements 340, including solder material such as, for example, solder balls 340, may be coupled to one or more electrical routing features 310 on the coreless substrate 304 and/or one or more electrical routing features 344 on circuit board 342 to form corresponding solder joints that are configured to further route the electrical signals of the die 302 to the circuit board 342.

In some embodiments, the circuit board 342 may be a printed circuit board (PCB) composed of an electrically insulative material such as an epoxy laminate. For example, the circuit board 342 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Structures (not shown) such as traces, trenches, vias may be formed through the electrically insulating layers to route the electrical signals of the die 302 through the circuit board 342. The circuit board 342 may be composed of other suitable materials in other embodiments.

Only a portion of the circuit board 342 may be depicted in FIG. 3. The circuit board 342 may include other electrical devices coupled to the circuit board that are configured to route electrical signals to or from the die 302 through the circuit board 342. The circuit board 342 may be a motherboard (e.g., printed circuit board 842 of FIG. 8) in some embodiments.

The circuit board 342 may include a solder resist layer 346 formed to protect surfaces of the circuit board 342 that do not form solder connections with the interconnect elements 340. Openings may be formed or otherwise provided in the solder resist layer 346 to expose surfaces of the electrical routing features 344 and passive devices 330 to allow formation of solder connections with the interconnect elements 340.

According to various embodiments, one or more passive devices 330 may be coupled to passive device pads 316 of coreless substrate 304. In some embodiments, passive devices 330 may be integral to the circuit board 342. The passive devices 330 may be integrally formed using fabrication processes that form the circuit board (e.g., lamination, deposition, patterning, drilling, etc.) and may, thus, be an integral part of the circuit board 342. In other embodiments, passive devices 330 may be disposed between circuit board 342 and coreless substrate 304. In still other embodiments, passive devices 330 may be partially or fully disposed within coreless substrate 304. In yet still other embodiments, passive devices 330 may be discrete devices separately formed from and coupled with the circuit board 342 or coreless substrate 304. In various embodiments, passive devices 330 may be one or more capacitors. Alternatively, in other embodiments, passive devices 330 may include one or more inductors, resistors, and the like.

Figure 4:
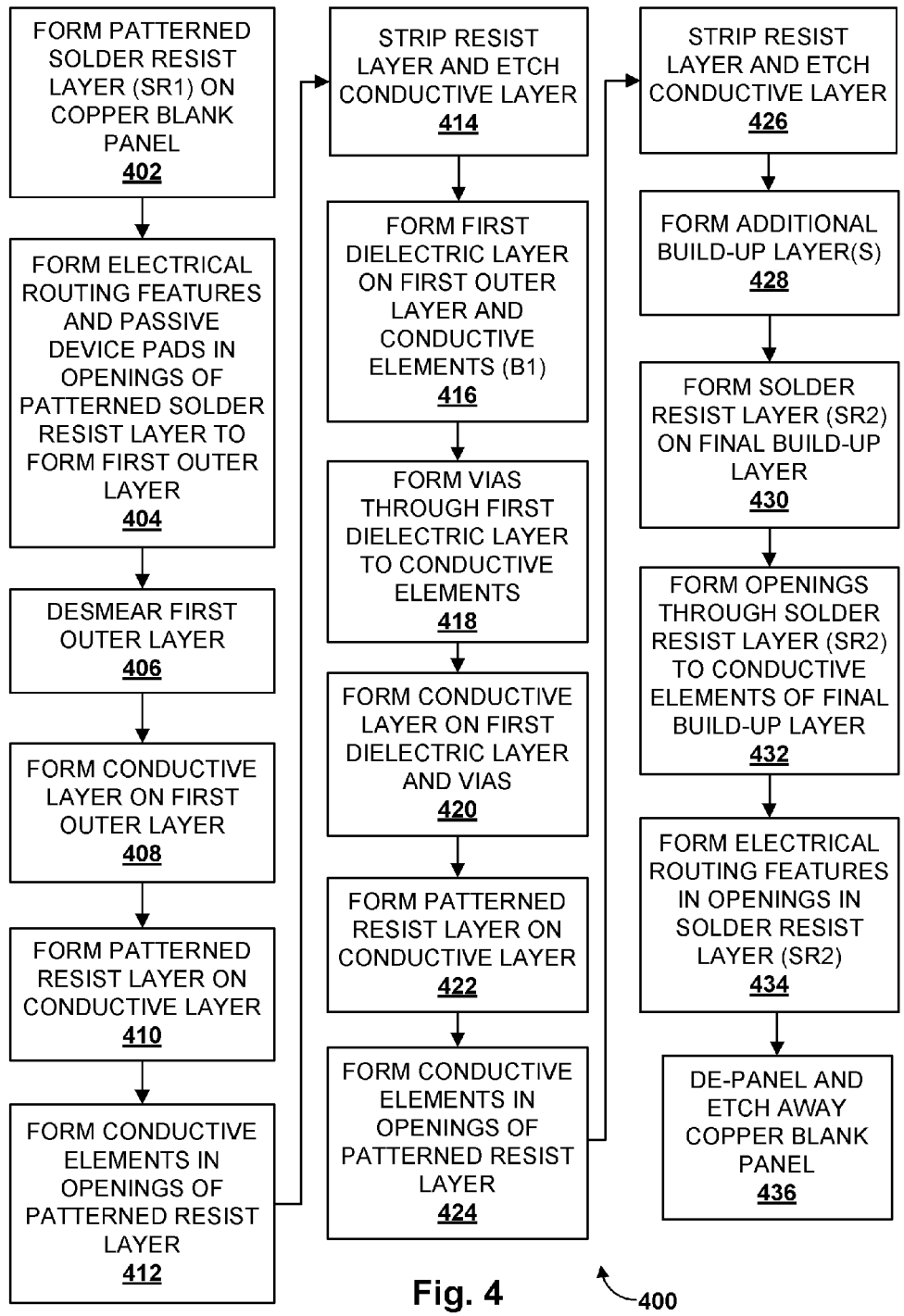
FIG. 4 schematically illustrates a flow diagram for a method of fabricating a package assembly as illustrated in FIG. 1, in accordance with some embodiments.
Figure 5A:
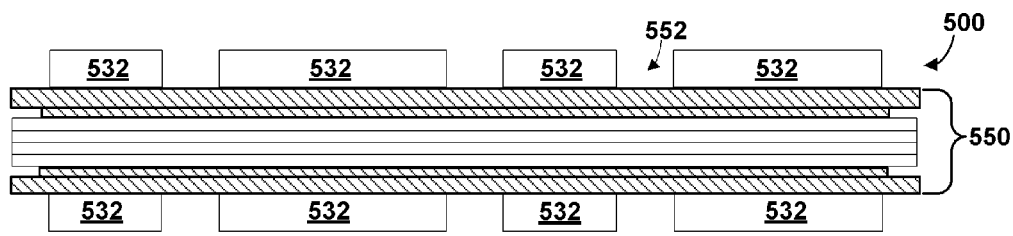
FIGS. 5a-5s schematically illustrate various stages of package assembly fabrication, in accordance with various embodiments.

FIG. 4 schematically depicts an example fabricating process flow 400. FIGS. 5a-5s depict an example coreless substrate 500 in various stages of fabrication that correspond to points in fabricating process flow 400. Accordingly, as process flow 400 is described, reference will be made to corresponding stages in FIGS. 5a-5s. Again, corresponding components are identified by corresponding numbers. For example, passive device pad 116 of FIG. 1 is depicted in FIG. 2 as 216, in FIG. 3 as 316, and in FIGS. 5a-5s as 516.

Referring first to FIGS. 4 and 5a, at block 402 a first outer layer 532 may be formed on a blank panel 550. In process flow 400, first outer layer 532 is a patterned solder resist layer, which may be formed on the copper surface of blank panel 550 by any known method. In some embodiments, the solder resist layer may be formed using a photo reactive solder resist material, and the solder resist layer may be patterned to form openings 552 that extend to the surface of blank panel 550. In some embodiments, the solder resist layer may be formed by pressing the solder resist on blank panel 550 using a laminator, by roller coating, or by printing. The solder resist layer may be patterned by known lithographic techniques. For example, openings 552 may be formed by applying a photo mask to the solder resist layer and applying ultraviolet (UV) light.

In various embodiments, the blank panel 550 may be a peelable core, and may be constructed with various materials, such as copper (Cu). For example, a blank panel 550 may include several layers of epoxy resin disposed between layers of copper. In various embodiments, structures may be formed on a first side of the blank panel and also on the opposite second side of the blank panel. In addition, in some embodiments, duplicate structures may be formed along the length of the first side (e.g., to make two or more coreless structures) and additional duplicate structures may be formed along the length of the second side. FIGS. 5a-5s depict what will become two coreless substrates 500 (one on each side of blank panel 550).

Figure 5B:
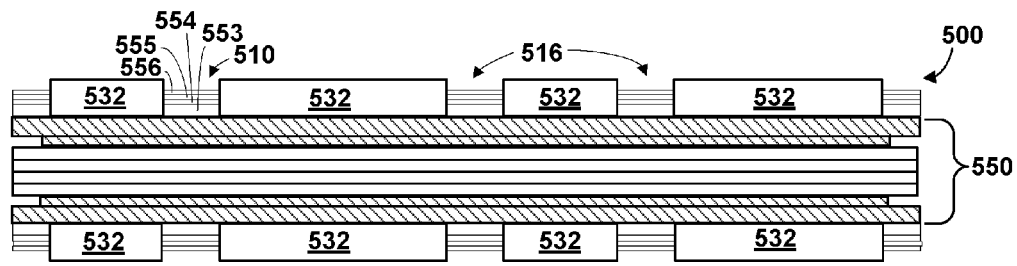

At block 404, electrical routing features 510 and passive device pads 516 may be formed in the openings 552 of first outer layer 532 (see FIG. 5b). In various embodiments, forming electrical routing features 510 and/or passive device pads 516 may include depositing metal layers in openings 552. In some embodiments, a first metal layer 553, such as a layer of copper, may be deposited or plated into openings 552 on the copper surface of blank panel 550. One or more additional metal layers may be formed on first metal layer 553. For example, a second metal layer 554 may be formed on first metal layer 553, a third metal layer 555 may be formed on second metal layer 554, and a fourth metal layer 556 may be formed on third metal layer 555. In some embodiments, second metal layer 554 may be gold, third metal layer 555 may be palladium, and fourth metal layer 556 may be nickel. In other embodiments, electrical routing features 510 and/or passive device pads 516 may include fewer or more layers of metal or other conductive materials.

At block 406, a conventional desmearing process may be performed in order to roughen the surface of the solder resist layer and/or to eliminate residue.

Figure 5C:
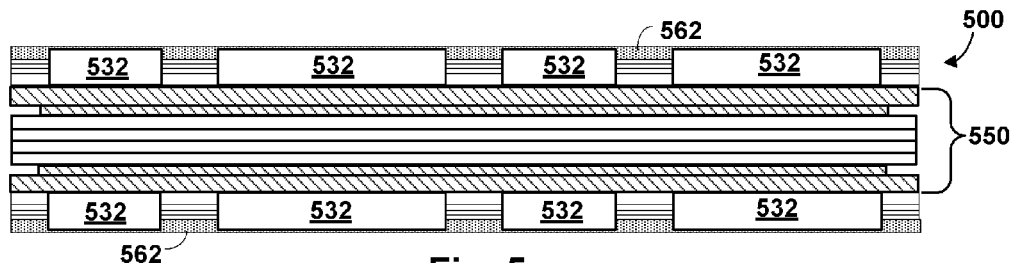

Referring now to FIG. 5c, at block 408, a conductive layer 562 may be formed on the first outer layer 532, electrical routing features 510, and passive device pads 516. Conductive layer 562 may be formed by various plating techniques. In various embodiments, conductive layer 562 is formed by an electroless plating process. In some embodiments, conductive layer 562 may be a layer of copper formed by an electroless plating process. In other embodiments, conductive layer 562 may be formed by a sputter copper process. Conductive layer 562 may fill the remaining space within openings 552 and thinly cover the outer surface of first outer layer 532. In other embodiments a conductive layer may be formed as discontinuous layer, extending over less than the entire surface of an underlying layer. For example, conductive layer 562 may be selectively formed using a lithography mask that defines a "keep out zone" or "KOZ," to prevent plating in one or more areas. Other conductive layers described herein may also be selectively formed to achieve various electrical routing objectives.

Figure 5D:
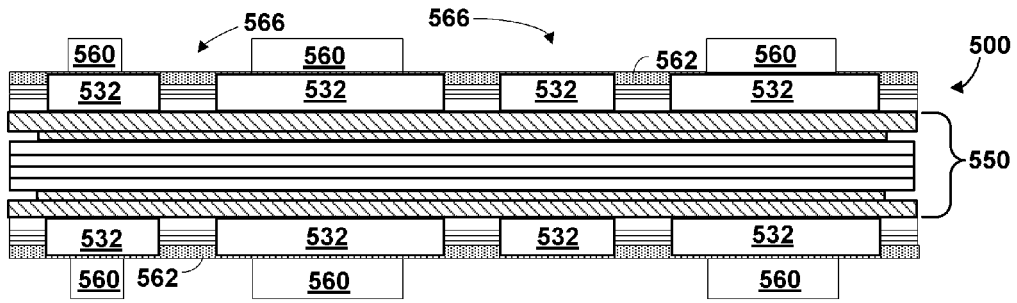

At block 410, a patterned resist layer 560 may be formed on conductive layer 562 (see FIG. 5d). In various embodiments, patterned resist layer 560 may be formed by laminating a layer of dry film resist (DFR) onto conductive layer 562 and patterning the layer of DFR by known lithographic processes (e.g., photo mask and UV light). In other embodiments, patterned resist layer 560 may be formed using another material such as a liquid film. Patterned resist layer 560 includes openings 566, through which portions of conductive layer 562 not covered by patterned resist layer 560 are exposed.

Figure 5E:
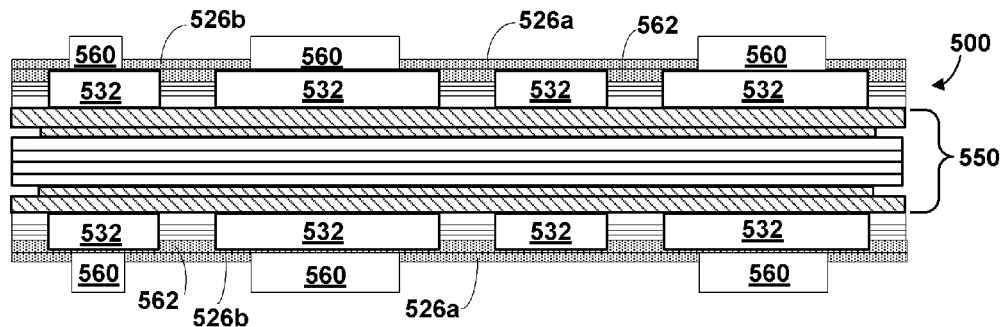

As shown for example in FIG. 5e, at block 412, conductive elements 526a-b may be formed on the exposed portions of conductive layer 562 in openings 566 of patterned resist layer 560. As was described above with reference to FIG. 1, two passive device pads 516 may be connected to conductive element 526a by conductive layer 562. Conductive elements 526a-b and conductive layer 562 may be formed from a conductive material, such as one or more metals. In various embodiments, conductive elements 526a-b and conductive layer 562 may be formed from copper. In some embodiments, conductive elements 526a-b may be formed by an electrolytic plating process. For example, in various embodiments, conductive elements 526a-b may be formed by an electrolytic copper plating process. In other embodiments, one or both of conductive layer 562 and conductive elements 526a-b may be formed by another known process for forming electrical paths.

Figure 5F:
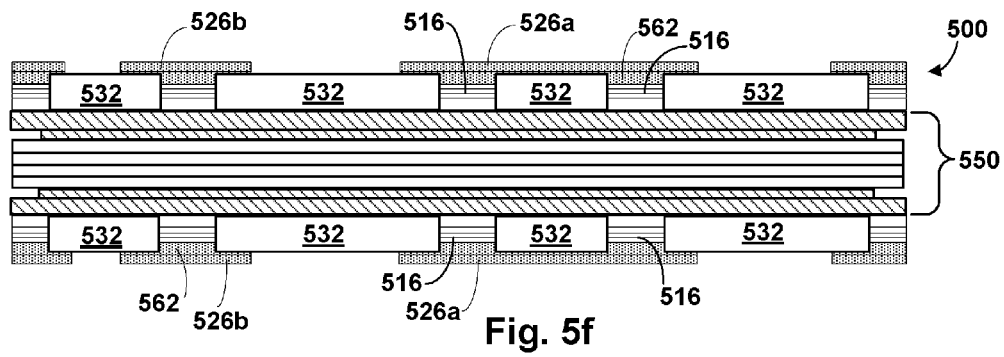

At block 414, patterned resist layer 560 may be removed, exposing the portions of conductive layer 562 not covered by conductive elements 526a-b. These uncovered portions of conductive layer 562 may be removed by flash etching (see FIG. 5f). Patterned resist layer 560 may be removed by known chemical processes (e.g., with hydroxide-based, amine-based, or low-swell photo resist strippers). Similarly, the uncovered portions of conductive layer 562 may be removed by flash etching using conventional methods.

Figure 5G:
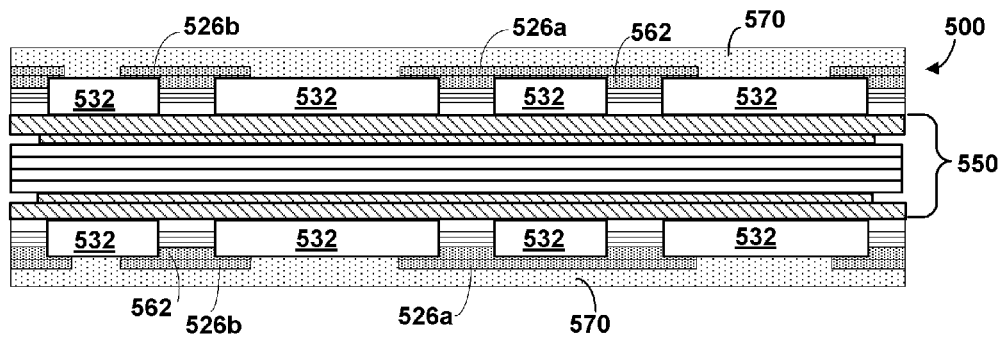

At block 416, a first dielectric layer 570 may be formed on the first outer layer 532 and conductive elements 526a-b (see FIG. 5g). First dielectric layer 570 may be, for example, ABF laminate.

Figure 5H:
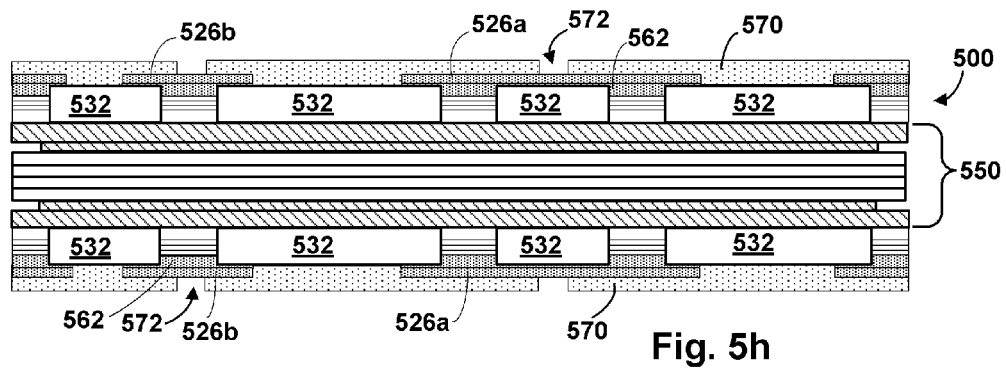

At block 418, vias 572 may be formed through first dielectric layer 570 to conductive elements 526a-b (see FIG. 5h). In some embodiments, vias 572 may be formed by laser drilling using known methods. In various embodiments, a laser such as, for example, an ultraviolet and/or carbon dioxide laser, may be used to drill vias 572.

Figure 5I:
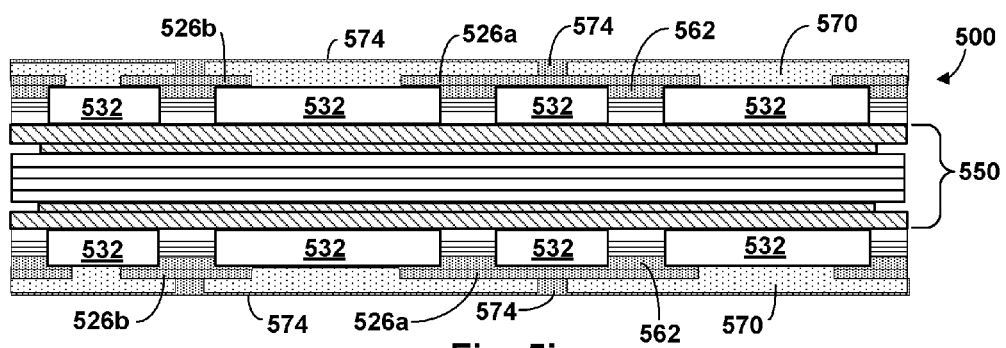

At block 420, a second conductive layer 574 may be formed on first dielectric layer 570 and vias 572. In some embodiments, second conductive layer 574 may be formed using the same or similar materials and processes as described above with regard to first conductive layer 562. An example of coreless substrate 500 at this stage is depicted in FIG. 5i.

As illustrated, first dielectric layer 570 may form a first build-up layer. Conductive layer 562 and conductive elements 526a-b may be disposed between dielectric layer 570 and first outer layer 532. Conductive layer 574 and additional conductive elements 526b may be disposed between first dielectric layer 570 and a second build-up layer. In other embodiments the first build-up layer may have a different configuration, as discussed further below by way of example. In various embodiments, one or more build-up layers described herein may have material properties that may be altered and/or optimized for reliability, warpage reduction, and so forth.

Figure 5J:
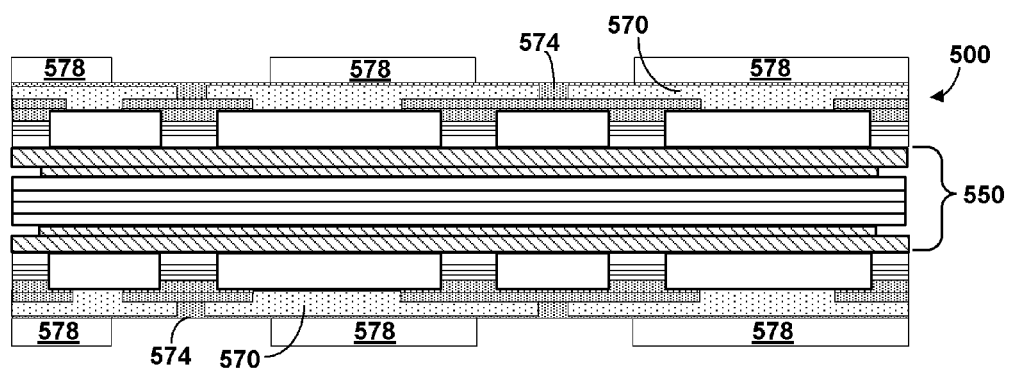
Figure 5K:
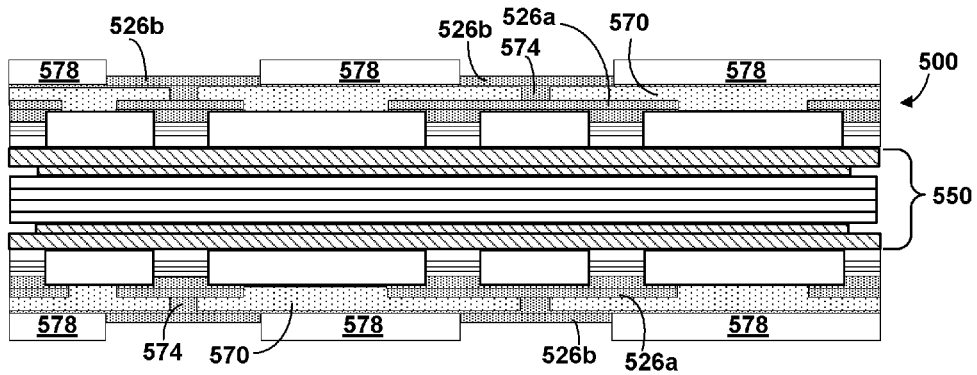
Figure 5L:
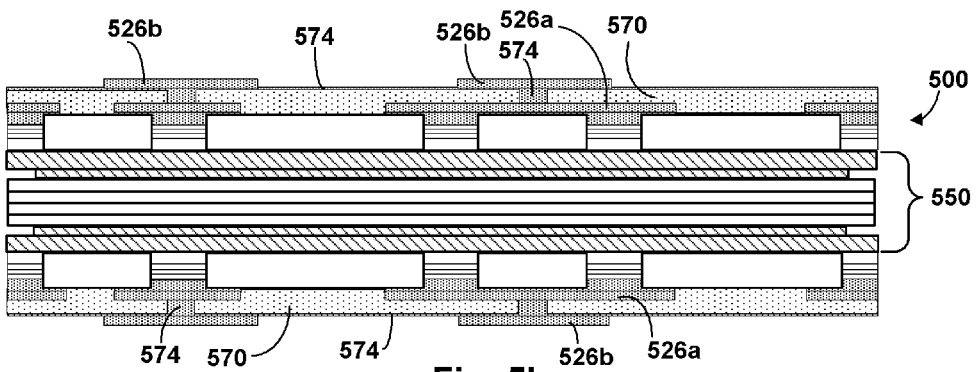
Figure 5M:
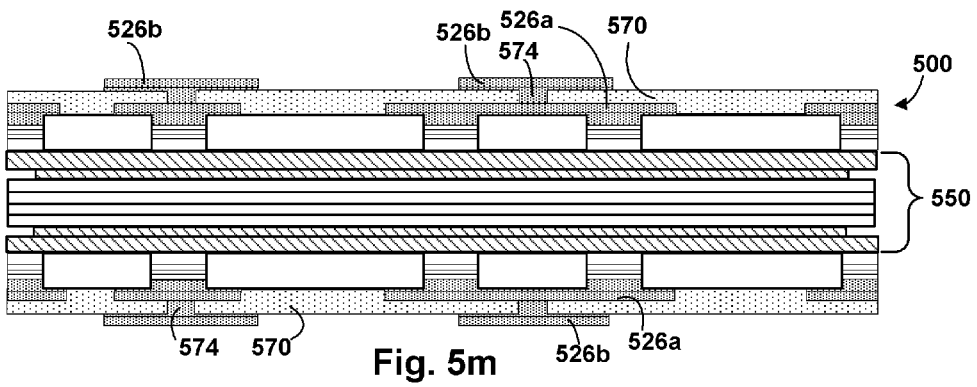

At blocks 422 to 426, additional conductive elements may be formed on the first build-up layer and first conductive layer 574 using the same or similar processes and materials described above with regard to blocks 410 to 414. At block 422, a patterned resist layer 578 may be formed on second conductive layer 574 (FIG. 5j) as described for block 410. At block 424, additional conductive elements 526b may be formed in openings of patterned resist layer 578 on portions of second conductive layer 574 (FIG. 5k), as described for block 412. At block 426, patterned resist layer 578 may be stripped (FIG. 5l), and other portions of second conductive layer 574 uncovered by the removal of patterned resist layer 578 may be removed by a flash etching process or other known process (FIG. 5m), as described for block 414.

Figure 5N:
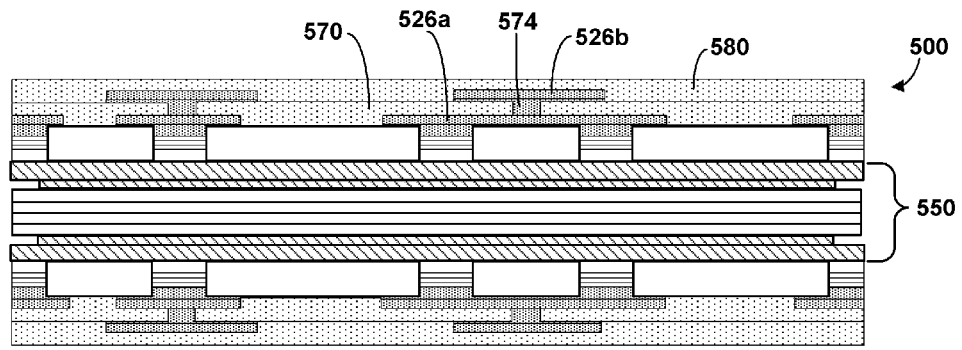

At block 428, one or more additional one or more build-up layers may be formed on the first dielectric layer 570 and corresponding conductive elements 526b using the same or similar processes and materials described in blocks 416 to 426. An example of coreless substrate 500 after the addition of a second dielectric layer 580 for the formation of a second build-up layer is depicted in FIG. 5n. In other embodiments, conductive element 526a may be formed on or between the additional build-up layers.

Figure 5O:
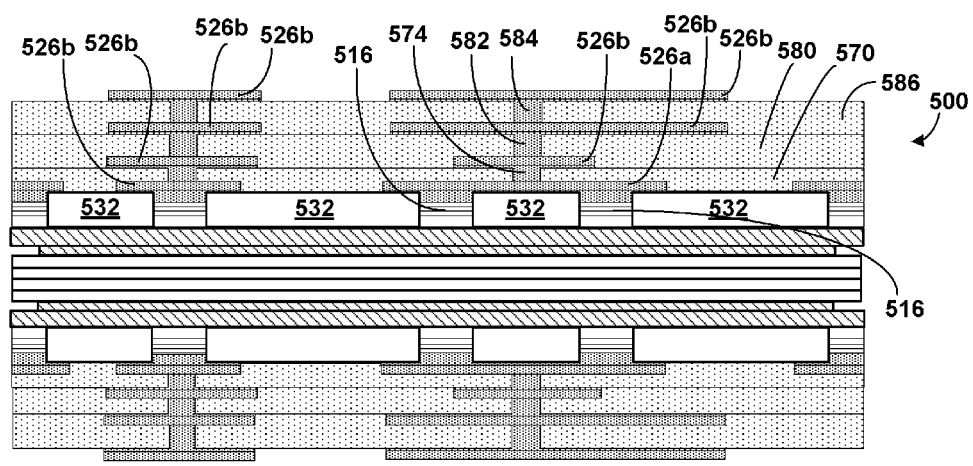

FIG. 5o illustrates an example of coreless substrate 500 after the formation of three build-up layers on the first outer layer 532. In FIG. 5o, coreless substrate 500 is shown with dielectric layers 570, 580, and 586, conductive layers 574, 582, and 584, and conductive elements 526a-b. Again, the conductive element that connects passive device pads 516 is indicated as 526a, and other conductive elements are indicated as 526b.

Figure 5P:
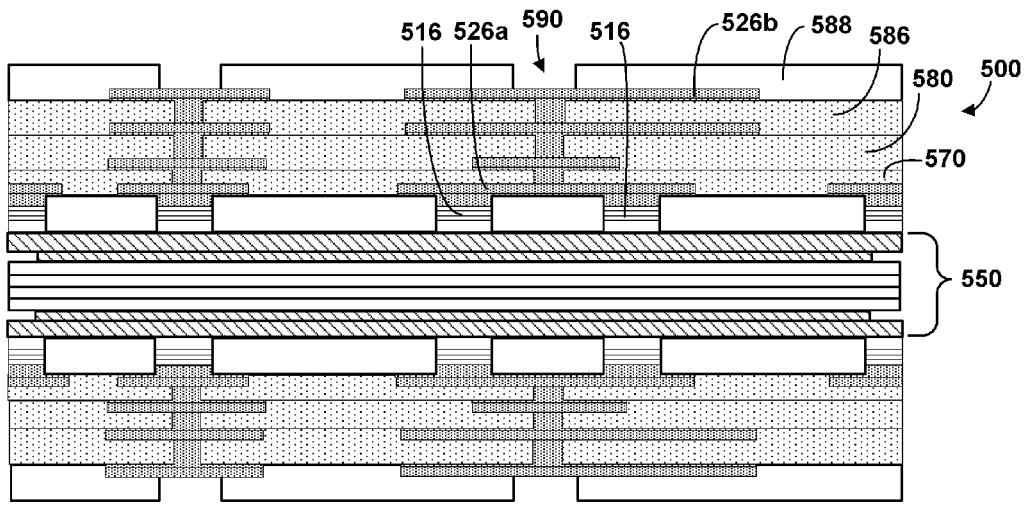

At block 430, a solder resist layer 588 may be formed on the outermost build-up layer. At block 432, openings may be formed through solder resist layer 588 to conductive elements 526b. FIG. 5p depicts coreless substrate 500 as shown FIG. 5*o* after the formation of solder resist layer 588 on dielectric layer 586 and corresponding conductive elements 526*b*, and after the formation of openings 590 in solder resist layer 588. Again, openings 590 may be formed by conventional methods. In various embodiments, solder resist layer 588 may be formed from a photo reactive material and patterned by known lithographic processes. For example, openings 590 may be formed in solder resist layer 588 by applying a photo mask and ultraviolet (UV) light.

Figure 5Q:
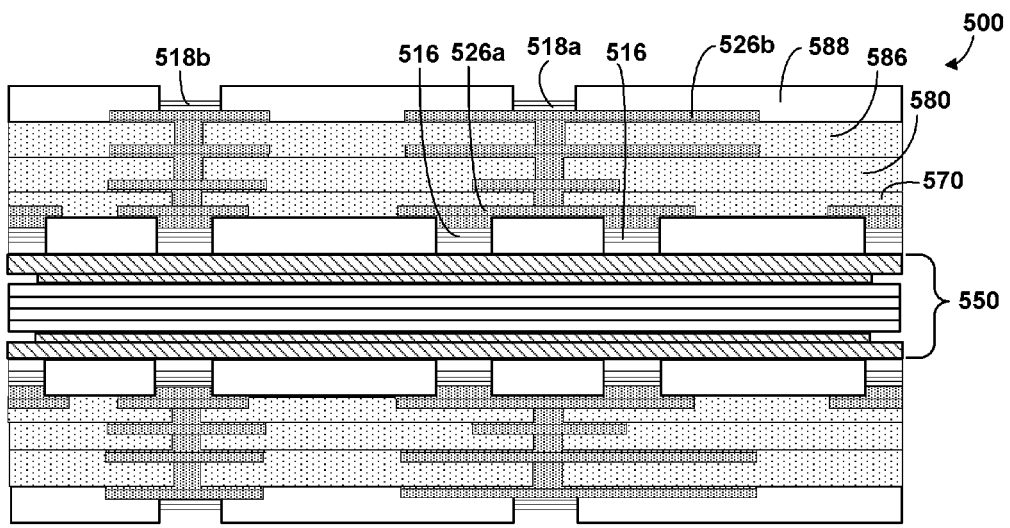

At block 434, electrical routing features 518 may be formed in the openings 590 in solder resist layer 588 (FIG. 5*q*). In various embodiments, electrical routing features 518*a*-*b* may be formed by plating or otherwise depositing one or more conductive layers (e.g., metal layer(s)). In some embodiments, electrical routing features 518*a*-*b* may include one or more layers of nickel, palladium, or gold. In other embodiments, electrical routing features 518*a*-*b* may include a layer of electroless nickel immersion gold (ENIG) or ENIG and electroless gold (ENIG EG); electroless Nickel, electroless Palladium and Immersion gold (EN-EPIG); immersion Tin (ImSn); direct immersion gold (DIG); organic preservative Solderability (OSP); electroless Palladium immersion gold (EPIG). In various embodiments, electrical routing features 518*a*-*b* may be die bond pads. Electrical routing feature 518*a* may be electrically coupled with passive device pads 516 by the first electrical path 522, and electrical routing feature 518*b* may be electrically coupled with electrical routing feature 510 by the second electrical path 524 (see FIG. 5*s*).

Figure 5R:
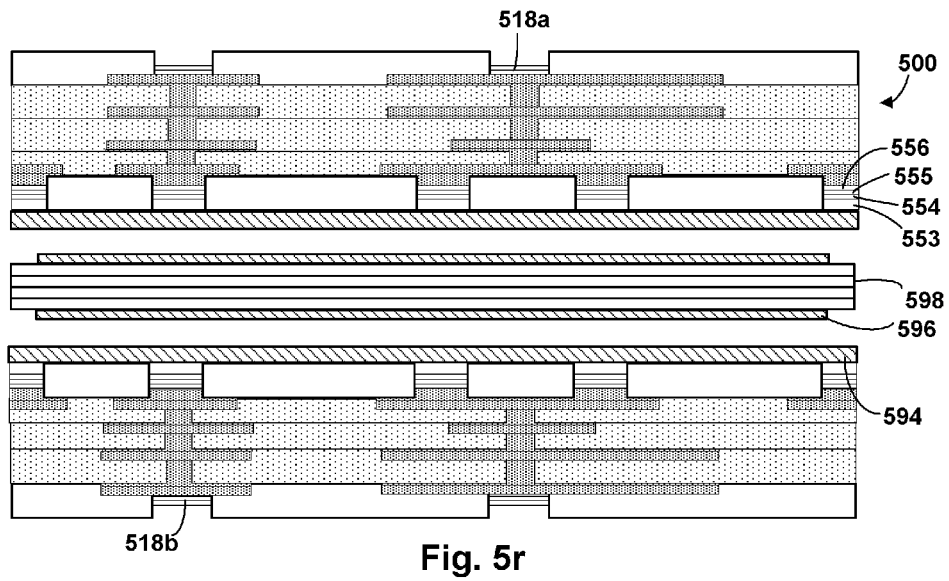
Figure 5S:
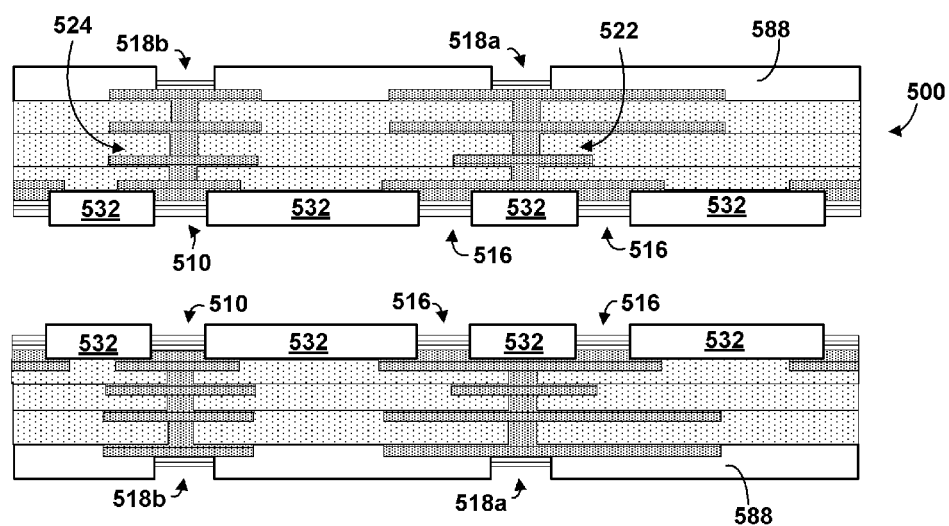

At block 436, the coreless substrates 500 may be removed from blank panel 550 (FIG. 5*r*). In various embodiments, blank panel 550 may be removed by cutting or otherwise severing the lateral ends of blank panel 550 and separating the outermost copper layers 594 from the next adjacent copper layers 596, leaving the next adjacent copper layers attached to the epoxy resin core 598. The outermost copper layers 594 of the blank panel 550 may remain attached to the coreless substrate(s) 500. The outermost copper layers 594 may be removed from coreless substrate(s) 500 by a conventional etching process (FIG. 5*s*). First metal layer 553 may be removed using the same or similar etching process. In some embodiments, first metal layer 553 may be a layer of copper, second metal layer 554 may be a layer of gold, and first metal layer 553 may be removed to expose the surface of second metal layer 554.

Figure 6:
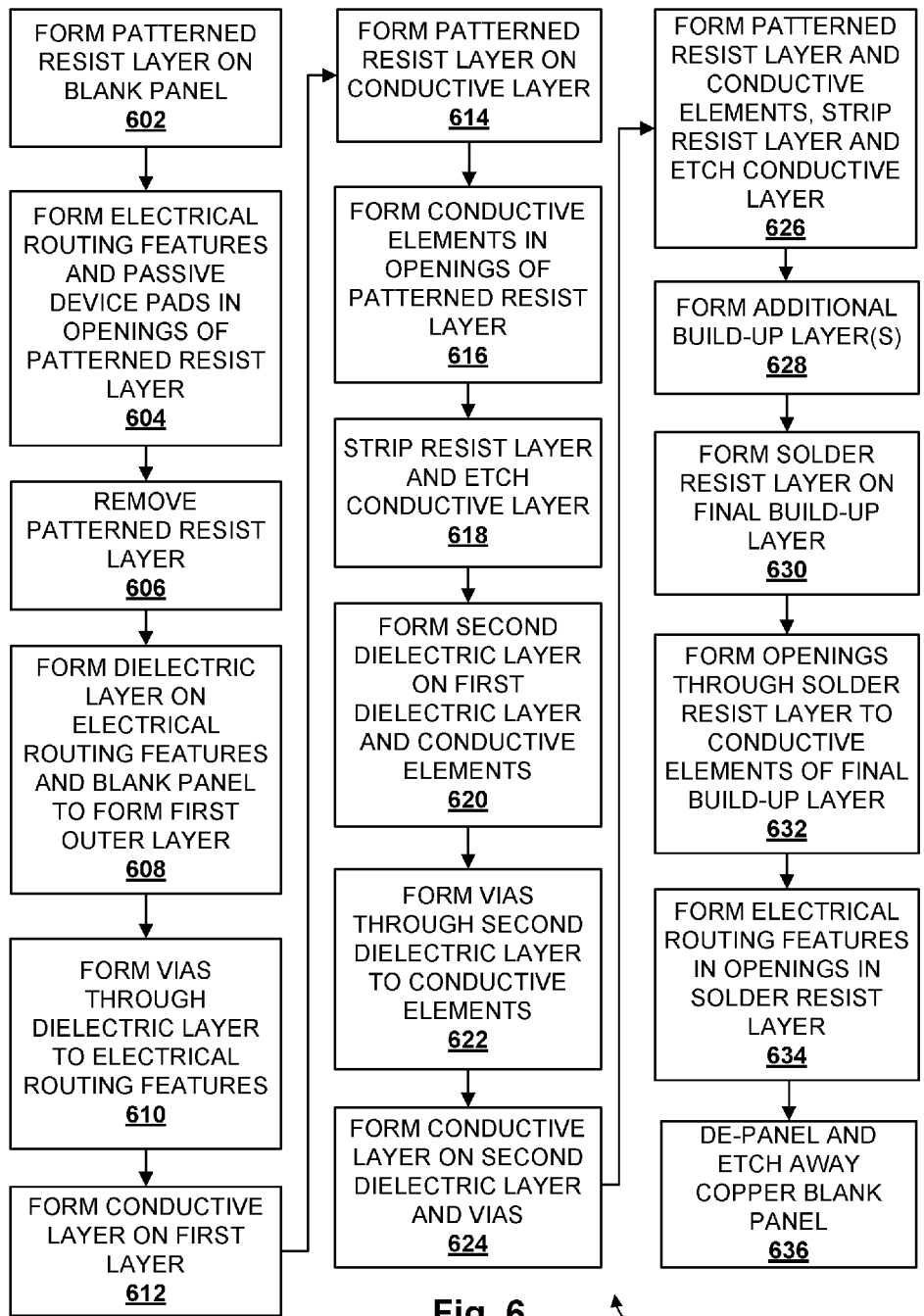
FIG. 6 schematically illustrates a flow diagram for a method of fabricating a package assembly as illustrated in FIG. 2, in accordance with some embodiments.
Figure 7A:
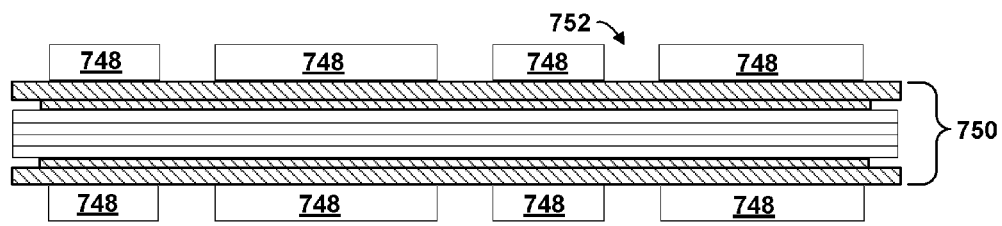
FIGS. 7a-7o schematically illustrate various stages of package assembly fabrication, in accordance with various embodiments.

FIG. 6 depicts another example fabricating process flow 600. FIGS. 7*a*-7*o* depict an example coreless substrate 700 in various stages of fabrication that correspond to points in fabricating process flow 600. Accordingly, as process flow 600 is described, reference will be made to corresponding stages in FIGS. 7*a*-7*o*. Again, components are numbered in accordance with FIGS. 1-3 and 5*a*-5*s*. Therefore, except where otherwise indicated, any description of a component should be understood to apply equally to components identified by corresponding numbers. For example, the above description of blank panel 550 should be understood to apply equally to blank panel 750.

In process flow 600, one or more coreless structures 700 may be formed on a blank panel. Again, structures may be formed on a first side of the blank panel and also on the opposite second side of the blank panel. In addition, in some embodiments, duplicate structures may be formed along the length of the first side (e.g., to make two or more coreless structures) and additional duplicate structures may be formed along the length of the second side. FIGS. 7*a*-*o* depict what will become two coreless substrates 700 (one on each side of copper blank panel 750) at various stages of fabrication.

At block 602, a patterned resist layer 748 may be formed on blank panel 750 (FIG. 7*a*). Patterned resist layer 748 may be formed by applying a dry film resist to the surface of blank panel 750 and patterning the dry film resist using known lithographic techniques. For example, the dry film resist may be patterned by using a photo mask and ultraviolet (UV) light to create openings 752 through the dry film resist to the surface of blank panel 750.

Figure 7B:
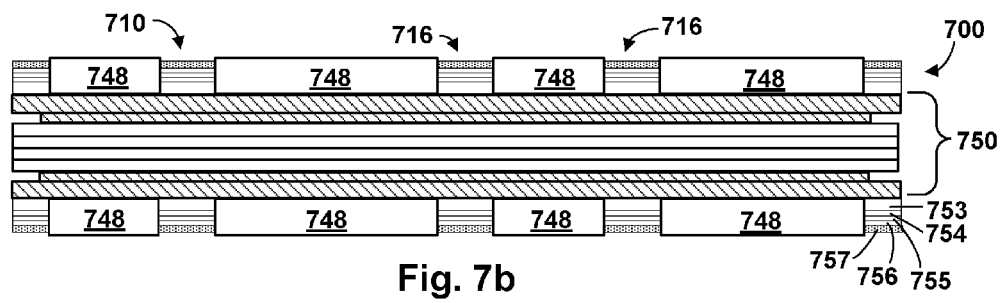

At block 604, electrical routing features 710 and passive device pads 716 may be formed in the openings 752 of the patterned resist layer (see FIG. 7*b*). In various embodiments, forming electrical routing features 710 and/or passive device pads 716 may include depositing metal layers in openings 752. In some embodiments, passive device pads 716 may be formed as described above. In other embodiments, passive device pads 716 may include a plurality of metal layers and the outermost layers may be copper. In some embodiments, a first metal layer 753, such as a layer of copper, may be deposited or plated into openings 752 on the copper surface of blank panel 750. One or more additional metal layers may be formed on first metal layer 753. For example, a second metal layer 754 may be formed on first metal layer 753, a third metal layer 755 may be formed on second metal layer 754, a fourth metal layer 756 may be formed on third metal layer 755. In various embodiments, a fifth metal layer 757 may be formed on fourth metal layer 756. For example, in some embodiments, second metal layer 754 may be gold, third metal layer 755 may be palladium, and fourth metal layer 756 may be nickel. Fifth metal layer 757 may be copper. In other embodiments, electrical routing features 710 and/or passive device pads 716 may include fewer or more layers of metal or other conductive materials.

Figure 7C:
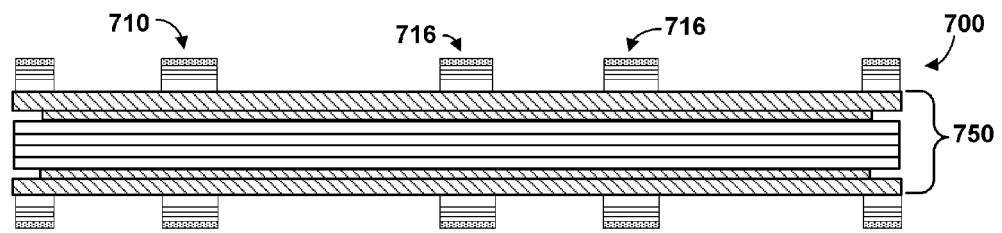

At block 606, patterned resist layer 748 may be removed from blank panel 750 (FIG. 7*c*). Patterned resist layer 748 may be stripped by conventional methods, such as by use of available resist stripping chemicals/techniques.

At block 608, a dielectric layer may be formed on electrical routing features 710 and passive device pads 716 to form a first outer layer 732. In contrast to first outer layer 532, first outer layer 732 may be a dielectric material such as ABF laminate.

Figure 7D:
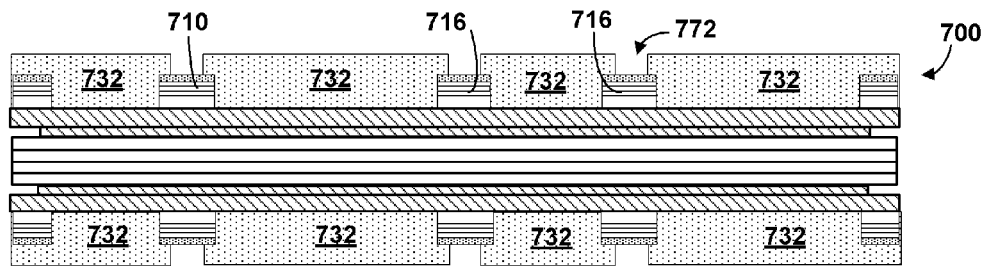

At block 610, vias 772 may be formed through the dielectric layer to electrical routing features 710 and passive device pads 716 (FIG. 7*d*). Vias 772 may be formed as described above (e.g., by laser drilling).

Figure 7E:
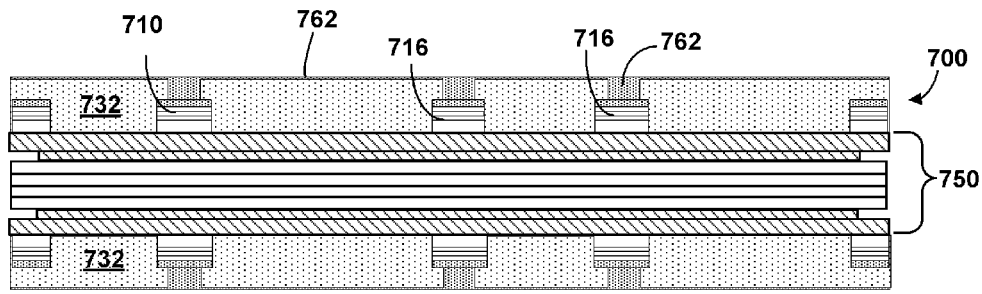

At block 612, a conductive layer 762 may be formed on the first outer layer 732 (i.e., on the dielectric layer and in vias 772). FIG. 7*e* depicts a coreless substrate 700 at this stage of process flow 600. Conductive layer 762 may be formed by various plating techniques as described above. In some embodiments, conductive layer 762 may be a layer of copper formed by an electroless plating process. Conductive layer 762 may thinly cover the outer surface of the dielectric layer. In some embodiments the conductive layer may be formed as discontinuous layer, extending over less than the entire surface of an underlying layer.

At blocks 614 to 636, build-up layers may be formed as described with reference to blocks 410 to 436 of process flow 400.

Figure 7F:
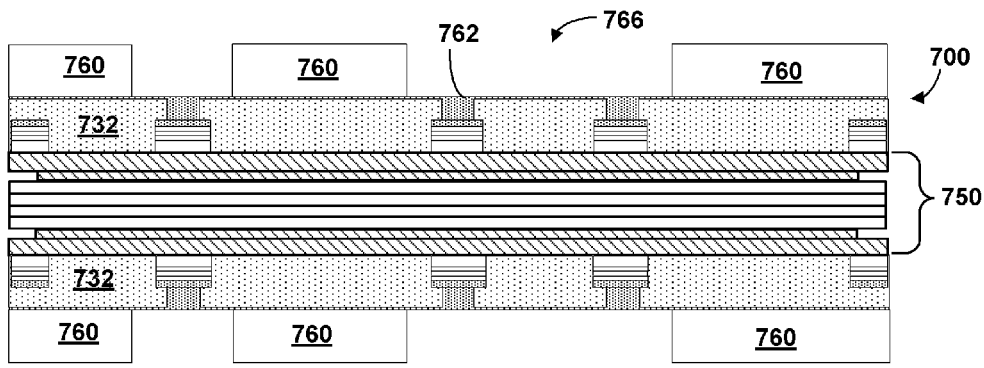
Figure 7G:
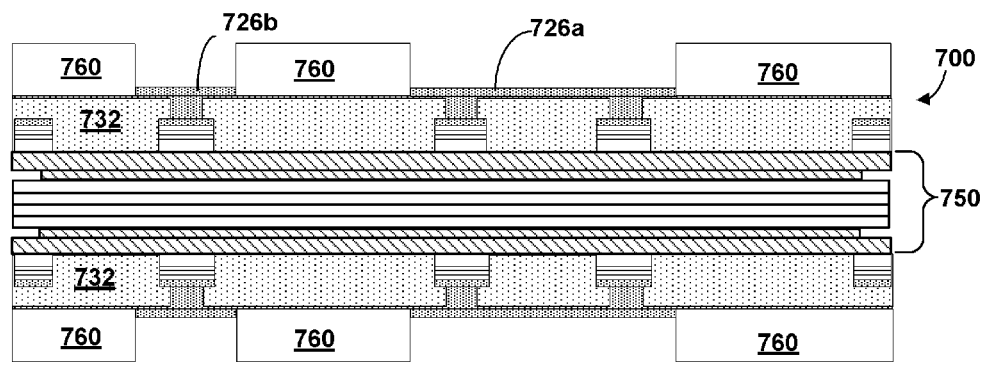

At block 614, a patterned resist layer 760 may be formed on conductive layer 762 (FIG. 7*f*). Patterned resist layer 760 may be formed as described above with reference to patterned resist layer 560. Patterned resist layer 760 includes openings 766, through which portions of conductive layer 762 not covered by patterned resist layer 760 are exposed.

At block 616, conductive elements 726a-b may be formed on the exposed portions of conductive layer 762 in openings 766 of patterned resist layer 760. Again, two passive device pads 716 may be connected to conductive element 726a by conductive layer 762. Conductive elements 726a-b and conductive layer 762 may be formed from a conductive material, such as one or more metals. In various embodiments, conductive elements 726a-b and conductive layer 762 may be formed from copper. In some embodiments, conductive elements 726a-b may be formed by an electrolytic plating process. For example, in various embodiments, conductive elements 726a-b may be formed by an electrolytic copper plating process. In other embodiments, one or both of conductive layer 762 and conductive elements 726a-b may be formed by another known process for forming electrical paths. In other embodiments, conductive elements 526b may be formed at block 616, and a conductive element 526a may be formed on or between additional build-up layers.

Figure 7H:
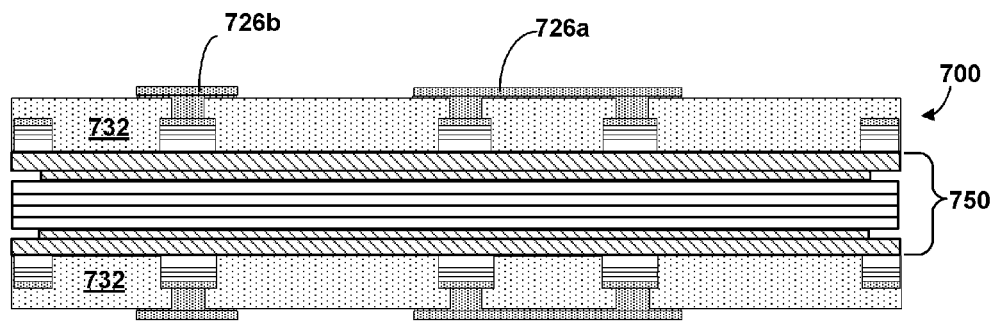

At block 618, patterned resist layer 760 may be removed, exposing the portions of conductive layer 762 not covered by conductive elements 726a-b (FIG. 7h). Patterned resist layer 760 and uncovered portions of conductive layer 762 may be removed as described above.

Figure 7I:
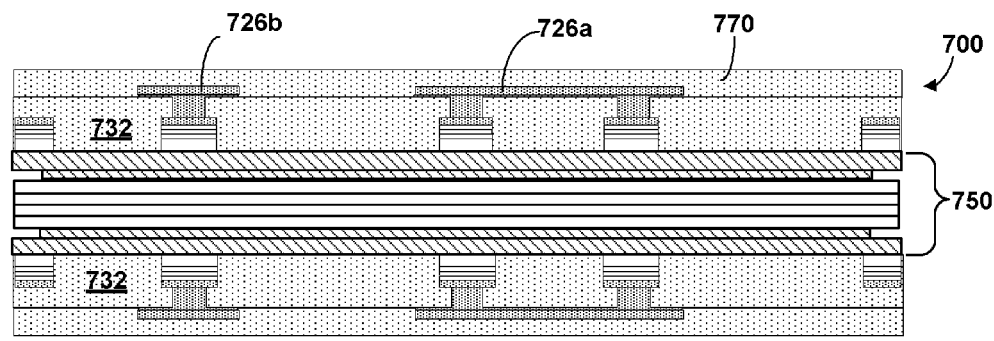

At block 620, a dielectric layer 770 may be formed on the first outer layer 732 and conductive elements 726a-b (FIG. 7i). Dielectric layer 770 may be, for example, ABF laminate.

Figure 7J:
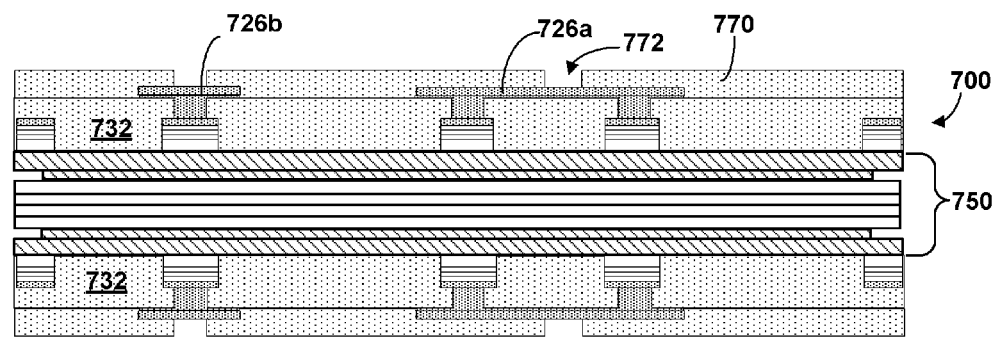

At block 622, vias 772 may be formed through dielectric layer 770 to conductive elements 726a-b (FIG. 7j).

At block 624, a second conductive layer 774 may be formed on dielectric layer 770 and vias 772. In some embodiments, second conductive layer 774 may be formed using the same or similar materials and processes as described above with regard to first conductive layer 762.

Figure 7K:
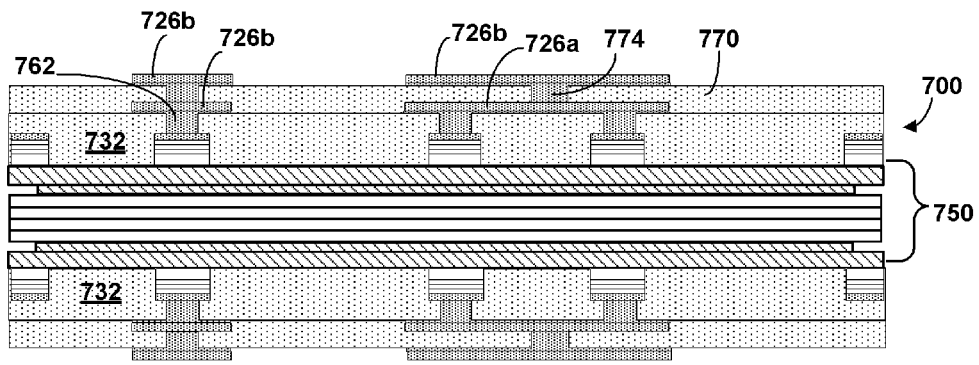

At block 626, a patterned resist layer and additional conductive elements 726b may be formed as described above. The patterned resist layer may then be stripped, and the portions of the second conductive layer 774 uncovered by removal of the patterned resist layer may be removed, again as described above. FIG. 7k depicts a coreless substrate 700 at this stage of process flow 600.

Dielectric layer 770 may form a first build-up layer. Conductive layer 762 and conductive elements 726a-b may be disposed between dielectric layer 770 and first outer layer 732. Conductive layer 774 and additional conductive elements 726b may be disposed between dielectric layer 770 and a second build-up layer.

Figure 7L:
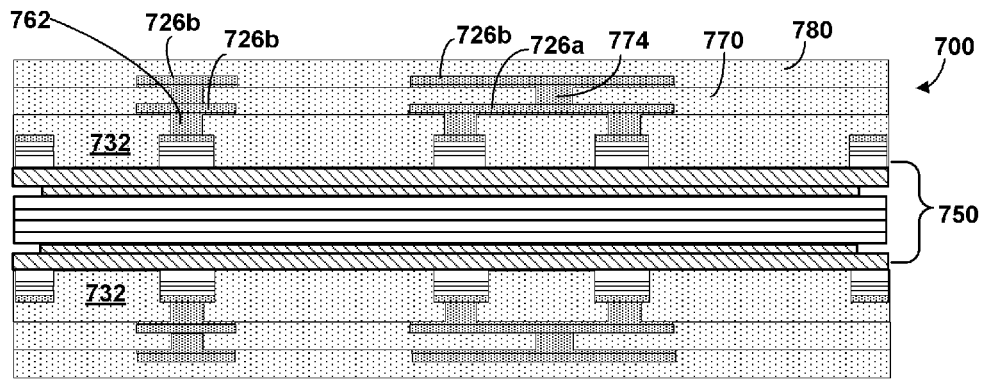

At block 628, an additional one or more build-up layers may be formed on dielectric layer 770 and corresponding conductive elements 726b using the same or similar processes and materials as described in blocks 620 to 626. An example of coreless substrate 700 after the addition of a second dielectric layer 780 for the formation of a second build-up layer is depicted in FIG. 7l. Again, the conductive element that connects passive device pads 716 is indicated as 726a, and other conductive elements are indicated as 726b.

Figure 7M:
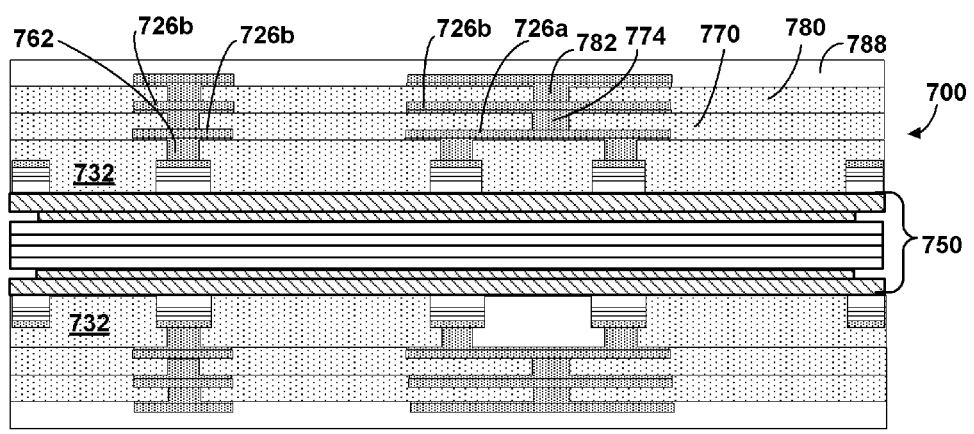

At block 630, a solder resist layer 788 may be formed on the outermost build-up layer. FIG. 7m illustrates a coreless substrate 700 with two build-up layers between solder resist layer 788 and first outer layer 732. The two build-up layers include dielectric layers 770 and 780, conductive layers 762, 774, and 782, and conductive elements 726a-b. Other embodiments may have more than two build-up layers.

At block 632, openings may be formed through solder resist layer 788 to conductive elements 726b as described above with reference to block 432 of process flow 400.

Figure 7N:
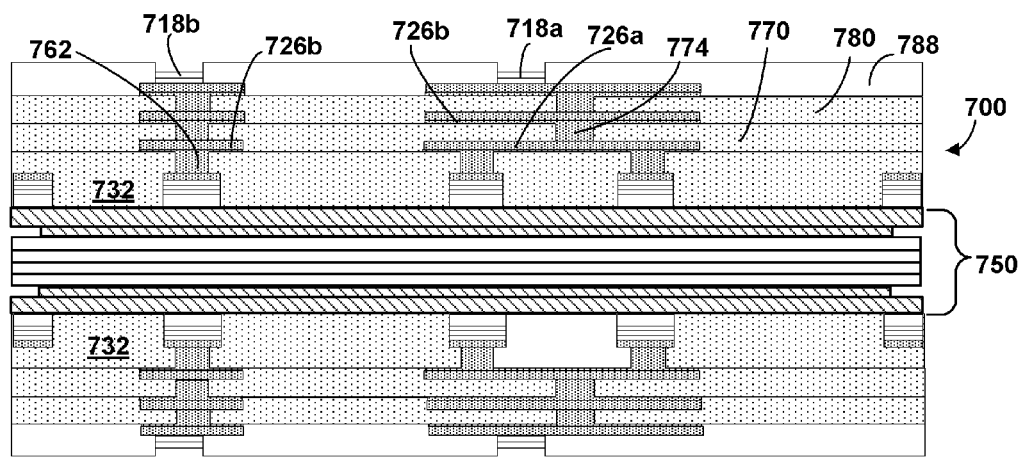
Figure 7O:
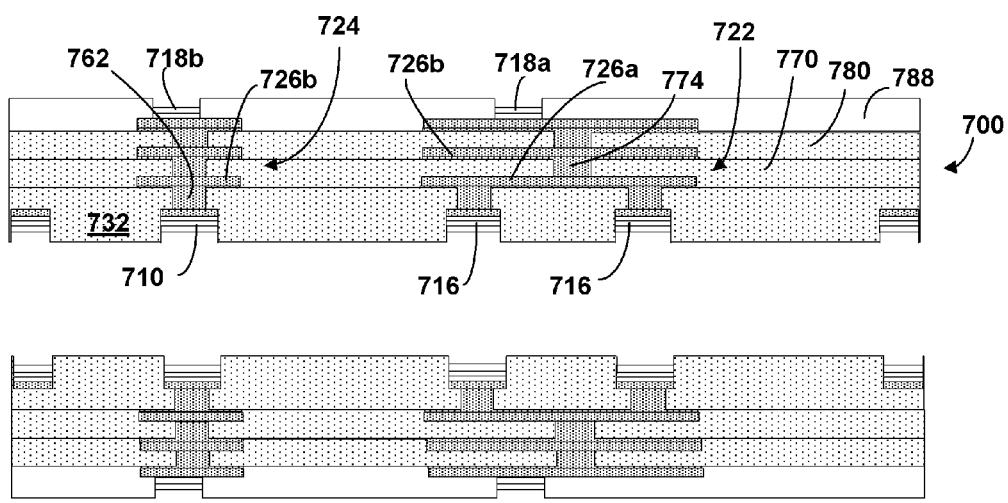

At block 634, electrical routing features 718a-b may be formed in the openings in solder resist layer 788 as described above with reference to block 434 of process flow 400. FIG. 7n depicts coreless substrate 700 after the formation of solder resist layer 788 and electrical routing features 718a-b. In various embodiments, electrical routing features 718a-b may be formed by plating or otherwise depositing one or more conductive layers (e.g., metal layer(s)). In some embodiments, electrical routing features 718a-b may include one or more layers of nickel, palladium, or gold. In other embodiments, electrical routing features 718a-b may include a layer of electroless nickel immersion gold (ENIG) or ENIG and electroless gold (ENIG EG); electroless Nickel, electroless Palladium and Immersion gold (EN-EPIG); immersion Tin (ImSn); direct immersion gold (DIG); organic preservative Solderability (OSP); electroless Palladium immersion gold (EPIG). In various embodiments, electrical routing features 718a-b may be die bond pads. Electrical routing feature 718a may be electrically coupled with passive device pads 716 by the first electrical path 722, and electrical routing feature 718b may be electrically coupled with electrical routing feature 710 by the second electrical path 724 (see FIG. 7o).

At block 636, the coreless substrates 700 may be removed from blank panel 750 as described above with reference to block 436 of process flow 400. Again, blank panel 750 may be peeled away from coreless substrate 700, with an outermost copper layer of blank panel 750 remaining attached to the first outer layer 732. The copper layer and/or first metal layer 753 may be removed from coreless substrate(s) 750 by a conventional etching process. In some embodiments, first metal layer 753 may be a layer of copper, second metal layer 754 may be a layer of gold, and first metal layer 553 may be removed to expose the surface of second metal layer 754. FIG. 7o depicts two coreless substrates 700 after removal of blank panel 750 and etching of first metal layer 553.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

FIG. 8 illustrates an example computing device 800, in accordance with various embodiments. Components are numbered in this Figure without reference to the numbering scheme of FIGS. 1-7, and like numbers do not necessarily indicate corresponding components in prior Figures.

Package assemblies with coreless substrates as described herein may be installed on a computing device such as computing device 800. For example, a package assembly 801 is depicted. Package assembly 801 may include a coreless substrate 804 (e.g., coreless substrate 500 or 700) disposed between a primary logic die 802 and a decoupling capacitor 830. Coreless substrate 804 may include one, two, three, four, or more than four build-up layers. In addition, coreless substrate 804 may have two passive device pads coupled with a conductive element as described above. In some embodiments, a die of the package assembly 801 is a processor of the computing device 800. The term "processor" may refer to any device or portion of a device that processes electronic data from registers and/or memory to transform that electronic data into other electronic data that may be stored in registers and/or memory.

In various embodiments, at least one communication chip 806 may be physically and electrically coupled to package assembly 801. In further implementations, the communication chip 806 may be part of package assembly 801, e.g., as an additional die on or embedded in build-up layers in package assembly 801. In various embodiments, computing device 800 may include PCB 842. For these embodiments, the package assembly 801 and communication chip 806 may be disposed on the PCB 842. In alternate embodiments, the various components may be coupled without the employment of PCB 842.

Depending on its applications, computing device 800 may include other components that may or may not be physically and electrically coupled to the PCB 842. These other components include, but are not limited to, volatile memory (e.g., dynamic random access memory 808, also referred to as "DRAM"), non-volatile memory (e.g., read only memory 810, also referred to as "ROM"), flash memory 812, an input/output controller 814, a digital signal processor (not shown), a crypto processor (not shown), a graphics processor 816, one or more antenna 818, a display (not shown), a touch screen display 820, a touch screen controller 822, a battery 824, an audio codec (not shown), a video codec (not shown), a global positioning system ("GPS") device 828, a compass 840, an accelerometer (not shown), a gyroscope (not shown), a speaker 832, a camera 834, and a mass storage device (such as hard disk drive, a solid state drive, compact disk ("CD"), digital versatile disk ("DVD"))(not shown), and so forth. In various embodiments, various components may be integrated with other components to form a System on Chip ("SoC"). In further embodiments, some components, such as DRAM 808, may be embedded in or within package assembly 801.

The communication chips 806 may enable wired and/or wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to IEEE 702.20, General Packet Radio Service ("GPRS"), Evolution Data Optimized ("Ev-DO"), Evolved High Speed Packet Access ("HSPA+"), Evolved High Speed Downlink Packet Access ("HSDPA+"), Evolved High Speed Uplink Packet Access ("HSUPA+"), Global System for Mobile Communications ("GSM"), Enhanced Data rates for GSM Evolution ("EDGE"), Code Division Multiple Access ("CDMA"), Time Division Multiple Access ("TDMA"), Digital Enhanced Cordless Telecommunications ("DECT"), Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

In various implementations, the computing device 800 may be a laptop, a netbook, a notebook, an ultrabook, a smart phone, a computing tablet, a personal digital assistant ("PDA"), an ultra mobile PC, a mobile phone, a desktop computer, a server, a printer, a scanner, a monitor, a set-top box, an entertainment control unit (e.g., a gaming console), a digital camera, a portable music player, or a digital video recorder. In further implementations, the computing device 800 may be any other electronic device that processes data.

EXAMPLES

In various embodiments, coreless substrates, as well as methods for forming package assemblies with coreless substrates and systems incorporating such package assemblies, are described herein. In various embodiments, a package assembly may include a coreless substrate comprising a first side, a second side opposite to the first side, a plurality of build-up layers (e.g., BBUL) between the first side and the second side, two or more passive device pads disposed on the first side, and an electrical routing feature disposed on the second side. In various embodiments, the coreless substrate may include an electrical path defined in the plurality of build-up layers to route electrical power between the two or more passive device pads and the electrical routing feature. In various embodiments, the electrical path may include a conductive element disposed on or within the build-up layers, and the two or more passive device pads may be conductively coupled to the conductive element.

In various embodiments, a first solder resist layer may be disposed on the first side of the coreless substrate and a second solder resist layer may be disposed on the second side of the coreless substrate. The two or more passive device pads may be disposed within corresponding openings in the first solder resist layer, and the electrical routing feature may be disposed within a corresponding opening in the second solder resist layer. In other embodiments, a dielectric layer may be disposed on the first side of the coreless substrate and a solder resist layer may be disposed on the second side of the coreless substrate. The two or more passive device pads may be disposed within corresponding openings in the dielectric layer, and the electrical routing feature may be disposed within a corresponding opening in the solder resist layer.

In various embodiments, the two or more passive device pads may be capacitor pads. In various embodiments, the package assembly may further include a decoupling capacitor coupled with at least one of the capacitor pads. In various embodiments, the electrical routing feature disposed on the second side of the coreless substrate may be a first electrical routing feature and the electrical path may be a first electrical path, and the package assembly may further include a second electrical routing feature disposed on the first side of the coreless substrate, a third electrical routing feature disposed on the second side of the coreless substrate, and a second electrical path defined in the plurality of build-up layers to route electrical signals between the second electrical routing feature on the first side of the coreless substrate and the third electrical routing feature on the second side of the coreless substrate.

In various embodiments, one or more of the first and third electrical routing features may be a pad to route electrical signals of one or more dies. In various embodiments, the package assembly may further include a die coupled to one or more of the first and third electrical routing features. In various embodiments, the decoupling capacitor may be disposed at least partially within an opening in the first side of the coreless substrate. In various embodiments, the conductive element may be connected to the passive device pads by two or more vias and a layer of metal disposed between the conductive element and the two or more vias. In various embodiments, the two or more vias may extend through at least one of the build-up layers.

In various embodiments, a method may comprise providing a panel comprising a metal surface, forming on the panel a first outer layer of a coreless substrate, forming on the first outer layer one or more build-up layers with an electrical path defined therein, and forming an opposite second outer layer of the coreless substrate on the one or more build-up layers. In various embodiments, the first outer layer may comprise a first group of electrical routing features. In various embodiments, the electrical path may include a conductive element disposed on at least one of the one or more build-up layers. In various embodiments, the second outer layer may comprise a second group of electrical routing features, and the first group of electrical routing features may include at least two passive device pads. In various embodiments, the at least two passive device pads may be conductively coupled to the conductive element. In various embodiments, forming the first outer layer of the coreless substrate may comprise forming a resist layer on the panel, forming openings in the resist layer, wherein the openings are positioned to expose the metal surface, and forming the first group of electrical routing features in the openings.

In various embodiments, forming the first group of electrical routing features may comprise forming a plurality of metal layers in the openings. In various embodiments, the resist layer may be a layer of dry film resist material. In various embodiments, the two or more passive device pads may be capacitor pads. In various embodiments, the method may further include removing the dry film resist material after forming the first group of electrical routing features and forming a layer of dielectric material over the electrical routing features. In various embodiments, the method may further comprise forming vias in the layer of dielectric material. In various embodiments, the vias may be positioned to expose the electrical routing features. In various embodiments, the method may further include performing an electroless deposition of metal on the dielectric material and in the vias to form a metal coating, forming a patterned resist layer on the metal coating, performing an electrolytic plating of metal into the one or more resist layer openings to form corresponding one or more electrically conductive traces on the exposed portions of the metal coating, and removing the patterned resist layer. In various embodiments, one of said one or more electrically conductive traces may be the conductive element.

In various embodiments, the patterned resist layer may have one or more resist layer openings positioned to expose portions of the metal coating. In various embodiments, removing the patterned resist layer may expose additional portions of the metal coating, and the method may further comprise removing the additional portions of the metal coating to expose portions of the dielectric material. In various embodiments, the layer of dielectric material may be a first layer of dielectric material, and forming a first one of the one or more build-up layers may comprise forming a second layer of dielectric material over the one or more electrically conductive traces and the first layer of dielectric material.

In various embodiments, the resist layer may be a layer of solder resist material and the two or more passive device pads may be capacitor pads. In various embodiments, the one or more build-up layers may include an outermost build-up layer with one or more additional electrically conductive traces. In various embodiments, the method may further include forming an opposite second outer layer of the coreless substrate on the one or more build-up layers may comprise forming a patterned solder resist layer over the outermost build-up layer. In various embodiments, the patterned solder resist layer may have having one or more solder resist layer openings positioned to expose corresponding portions of the additional electrically conductive traces, and the method may further include forming layers of metal within the solder resist layer openings to form the second group of electrical routing features. In various embodiments, the method may further include performing an electroless deposition of metal on the solder resist material and the first group of electrical routing features to form a metal coating, and forming a patterned resist layer on the metal coating. In various embodiments, the patterned resist layer may have one or more resist layer openings positioned to expose portions of the metal coating. In various embodiments, the method may further include performing an electrolytic plating of metal into the one or more resist layer openings to form corresponding one or more electrically conductive traces on the exposed portions of the metal coating, and removing the patterned resist layer. In various embodiments, one of said electrically conductive traces may be the conductive element. In various embodiments the patterned resist layer may be a patterned dry film resist layer.

In various embodiments, a system may comprise a printed circuit board (PCB) and a package assembly coupled with the PCB by interconnect elements disposed on the package assembly. In various embodiments, the package assembly may include a coreless substrate and a die. In various embodiments, the coreless substrate may comprise a first side with a first one or more electrical routing features and two or more passive device pads, an opposite second side with a second one or more electrical routing features, and a plurality of build-up layers between the first side and the second side. In various embodiments, the first one or more electrical routing features may be coupled with the interconnect elements. In various embodiments, the die may be coupled with the second one or more electrical routing features. In various embodiments, an electrical path may be defined in the plurality of build-up layers to route electrical power between the die and the two or more capacitor pads. In various embodiments, the electrical path may comprise a conductive element disposed on or within the build-up layers, and the two or more passive device pads may be conductively coupled to the conductive element.

In various embodiments, the first side of the coreless substrate may comprise a first solder resist layer and the second side of the coreless substrate may comprise a second solder resist layer. In various embodiments, the two or more passive device pads may be disposed within corresponding openings in the first solder resist layer. In various embodiments, the first side of the coreless substrate may comprise a dielectric layer disposed on the first side of the coreless substrate and a solder resist layer disposed on the second side of the coreless substrate. In various embodiments, the two or more passive device pads may be disposed within corresponding openings in the dielectric layer.

In various embodiments, the two or more passive device pads may be capacitor pads. In various embodiments, the package assembly may further include a third one or more electrical routing features disposed on the second side of the coreless substrate and coupled to the die. In various embodiments, the electrical path may be a first electrical path. In various embodiments, the package assembly may further comprise a second electrical path defined in the plurality of build-up layers to route electrical signals between the die and the PCB. In various embodiments, the first one or more electrical routing features and the third one or more electrical routing features may be conductively coupled with the second electrical path.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A package assembly comprising:
a coreless substrate comprising a first side, a second side opposite to the first side, and a plurality of build-up layers between the first side and the second side;
two or more passive device pads disposed on the first side of the coreless substrate, wherein each of the two or more passive device pads has a first surface and a second surface, and, for each of the two or more passive device pads, the second surface is disposed between the first surface and the coreless substrate;
an electrical routing feature disposed on the second side of the coreless substrate;
a first solder resist layer disposed on the first side of the coreless substrate, wherein the first solder resist layer has a first surface and a second surface, the second surface of the first solder resist layer is disposed between the first surface of the first solder resist layer and the coreless substrate, the two or more passive device pads are disposed within corresponding openings in the first solder resist layer, and the first surfaces of the two or more passive device pads are recessed from the first surface of the first solder resist layer; and
an electrical path defined in the plurality of build-up layers to route an electrical power between the two or more passive device pads and the electrical routing feature;
wherein the electrical path includes a conductive element disposed on or within the build-up layers and adjacent to the first solder resist layer, the two or more passive device pads being conductively coupled to the conductive element.

2. The package assembly of claim 1, further comprising a second solder resist layer disposed on the second side of the coreless substrate, the electrical routing feature disposed within a corresponding opening in the second solder resist layer.

3. The package assembly of claim 1, further comprising a dielectric layer disposed on the first side of the coreless substrate and a solder resist layer disposed on the second side of the coreless substrate, the two or more passive device pads disposed within corresponding openings in the dielectric layer, and the electrical routing feature disposed within a corresponding opening in the solder resist layer.

4. The package assembly of claim 1, wherein the two or more passive device pads are capacitor pads, the package assembly further including a decoupling capacitor coupled with one of the two or more capacitor pads.

5. The package assembly of claim 4, wherein the electrical routing feature disposed on the second side of the coreless substrate is a first electrical routing feature and the electrical path is a first electrical path, the package assembly further comprising:
a second electrical routing feature disposed on the first side of the coreless substrate;
a third electrical routing feature disposed on the second side of the coreless substrate; and
a second electrical path defined in the plurality of build-up layers to route electrical signals between the second electrical routing feature on the first side of the coreless substrate and the third electrical routing feature on the second side of the coreless substrate.

6. The package assembly of claim 5, wherein the second electrical routing feature is a pad to route electrical signals of one or more dies.

7. The package assembly of claim 1, wherein the conductive element is a trace.

8. The package assembly of claim 1, wherein the conductive element is formed of a metal.

9. The package assembly of claim 1, wherein the conductive element is formed of copper.

10. The package assembly of claim 1, wherein the conductive element is formed by an electrolytic plating process.

11. The package assembly of claim 1, wherein the conductive element is included in a single build-up layer.

* * * * *